(12) United States Patent
Abel et al.

(10) Patent No.: US 10,867,815 B2
(45) Date of Patent: Dec. 15, 2020

(54) PHOTONICALLY TUNED ETCHANT REACTIVITY FOR WET ETCHING

(71) Applicant: Tokyo Electron Limited, Tokyo (JP)

(72) Inventors: Paul Abel, Austin, TX (US); Omid Zandi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/548,481

(22) Filed: Aug. 22, 2019

(65) Prior Publication Data

US 2020/0075358 A1  Mar. 5, 2020

Related U.S. Application Data

(60) Provisional application No. 62/726,603, filed on Sep. 4, 2018.

(51) Int. Cl.
*H01L 21/67* (2006.01)
*G03F 7/42* (2006.01)
*G03F 7/004* (2006.01)

(52) U.S. Cl.
CPC ...... *H01L 21/67075* (2013.01); *G03F 7/0041* (2013.01); *G03F 7/423* (2013.01); *G03F 7/425* (2013.01)

(58) Field of Classification Search
CPC .................................................. H01L 21/67075
See application file for complete search history.

(56) References Cited

U.S. PATENT DOCUMENTS

2006/0180174 A1* 8/2006 Kevwitch ............... G03F 7/427
134/1.3

FOREIGN PATENT DOCUMENTS

WO      WO 00/07231 A1    2/2000

* cited by examiner

*Primary Examiner* — Roberts P Culbert
(74) *Attorney, Agent, or Firm* — Oblon, McClelland, Maier & Neustadt, L.L.P.

(57) ABSTRACT

A method and a system for etching of semiconductor substrates, and particularly, wet etching of wafers. The etch rate of liquid solutions applied on the wafer is adjusted by irradiating the liquid solutions with spatially varied light intensity. Photo-reactive agents are added to the liquid solutions, the agents including photo acids, photo bases and photo-oxidizers. Illumination of the photo-reactive agents causes increase/decrease of the pH value and oxidation potential value of the liquid solutions.

15 Claims, 3 Drawing Sheets

PHOTONICALLY TUNED ETCHANT REACTIVITY FOR WET ETCHING

CROSS REFERENCE TO RELATED APPLICATIONS

This application is based on and claims the benefit of and priority to U.S. Provisional Patent Application No. 62/726,603, entitled "PHOTONICALLY TUNED ETCHANT REACTIVITY FOR WET ETCHING", filed on Sep. 4, 2018, the entire contents of which are herein incorporated by reference.

BACKGROUND

Technical Field

The present application relates to etching of semiconductor substrates, and particularly to wet etching of wafers. More particularly, it relates to a method and a system for adjusting an etch rate of liquid solutions applied on the wafer by irradiating the liquid solutions with spatially varied light intensity.

Description of the Related Art

Semiconductor fabrication involves many different steps of depositing, growing, patterning, removal, and cleaning of wafers. Various different materials are added and removed or partially removed, while other materials remain. One removal technique is that of wet etching. Wet etching typically involves immersing wafers in a solution having an etchant, or dispensing such a solution on a wafer surface. The liquid solution, when in contact with the substrate, chemically reacts with a target material to release it from the substrate. The etched material is typically dissolved in, or physically carried away by, the etching solution.

A conventional wet etch solution has a set solution oxidation potential and a pH. This places the etch solution at single point on a Pourbaix (potential/pH) diagram. Solution parameters are set by the solution composition. This uniquely sets the thermodynamic equilibrium species that will be present when the solution is placed in contact with a surface to be etched. This also controls solubility of the etch products. Once a particular etch composition is determined, the etch behavior of a corresponding system is primarily based on temperature of the solution.

Solution composition and temperature are used to accomplish several objectives simultaneously. An etch rate for a given material preferably falls within a desired range. Preferably, a total etch time is compatible with high volume manufacturing, yet the etch rate is still slow enough to allow accurate control of an amount etched from the substrate. The reaction rates of other materials that are in contact with the etch solution along with the target material should be minimized. It is also desired that a stability of a given solution is maximized while cost is minimized. This multi-variable optimization can require performance compromises in one or more of these areas to achieve a specified or desired performance in other areas. An ideal etch solution simultaneously achieves all of the objectives listed above without compromise. Techniques disclosed herein provide additional control on the various solution variables with which to control etch behavior, and thus reduce a number of compromises in etch process development.

Additionally, non-uniformities in etchant composition and temperature over the surface of the wafer can cause non-uniformities in etch rate. This leads to a necessary compromise in etch-stop location in that there are either under-etched or over-etched areas on the wafer. Such non-uniform etching can lead to yield losses or degradation in device performance. The etch behavior of conventional wet chemical etchants is determined by composition and temperature. In many processes, compositions and temperatures required to achieve a desired etch behavior cause the etchants to become unstable. To control these processes, the etchant can be formulated immediately before use, which increases costs. During dispense there are other challenges. At high temperatures, evaporative cooling can significantly change the temperature of an etchant in a wet etching solution as it flows from the center of the wafer to the edge in a spin chamber. When etch rates have a strong temperature dependence, then the etch rate will decrease towards the edge of the wafer resulting in non-uniform etching.

SUMMARY

Techniques herein provide methods and systems to adjust an etch rate of liquid solutions using spatial resolution on the wafer to correct for non-uniformities in etchant composition and temperature over the surface of the wafer. Techniques include adding photoactive components to the etch solution. Such photoactive components may include a photo acid or a photo base to adjust a pH under illumination, and also a photo-oxidizer to change a solution oxidation potential under illumination. Dispensing of such etch solutions enables the accessing of an area on a Pourbaix diagram that can be accessed by changing the illumination conditions of the solution on a wafer. This technique greatly expands a range of etch behaviors that can be achieved with a single solution. Such solutions can be formulated to be inert and stable in the dark and become an active etchant under illumination.

Accordingly, such solutions solve problems associated with storage and unstable etch solutions. Moreover, because illumination can be spatially resolved, the etchant reactivity can be adjusted point by point across the surface of a wafer. Such spatial control across a wafer surface can be used to compensate for temperature variations across the wafer. Another advantage is that a single, stable solution can be stored for use, with many different types of etch operations with illumination being varied in both location and intensity to create a desired etch rate in real time based on characteristics of materials needing to be etched. Additionally, spatial variations in light intensity can be used to correct thickness variations across the wafer using feed-forward control. Thus, techniques here provide significant improvements and control to wet etch processes.

The method disclosed herein allows for temporal and spatial control of etch rate on a wafer. Feed forward control can be used to compensate for uneven layer thickness across the wafer. In addition, the method allows the etchant to be stored in a less reactive state so that it is more stable, less likely to react with the storage tank, dispensing line, filter, or valve wetted materials, and be less reactive in the waste stream. The etchant becomes more reactive under illumination with particular wavelengths.

In other techniques presented herein, time-varying illumination of a single photoactive etch solution, for example, toggling between illumination state and dark state, is used to perform a cyclic etch process, without the need to use one etch solution to chemically modify the material surface and another etch solution to dissolve the modified layer.

The order of the different steps as described herein is presented for clarity sake. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the features of the present application can be embodied and viewed in many different ways.

This summary section does not specify every embodiment and/or novel aspect of the present application. Instead, this summary only provides a preliminary discussion of different embodiments and corresponding points of novelty over conventional techniques. Additional details and/or possible perspectives of the disclosed embodiments are described in the Detailed Description section and corresponding figures of the present disclosure as further discussed below.

BRIEF DESCRIPTION OF THE DRAWINGS

The application will be better understood in light of the description which is given in a non-limiting manner, accompanied by the attached drawings in which.

DETAILED DESCRIPTION OF THE PREFERRED EMBODIMENTS

Figure 1:
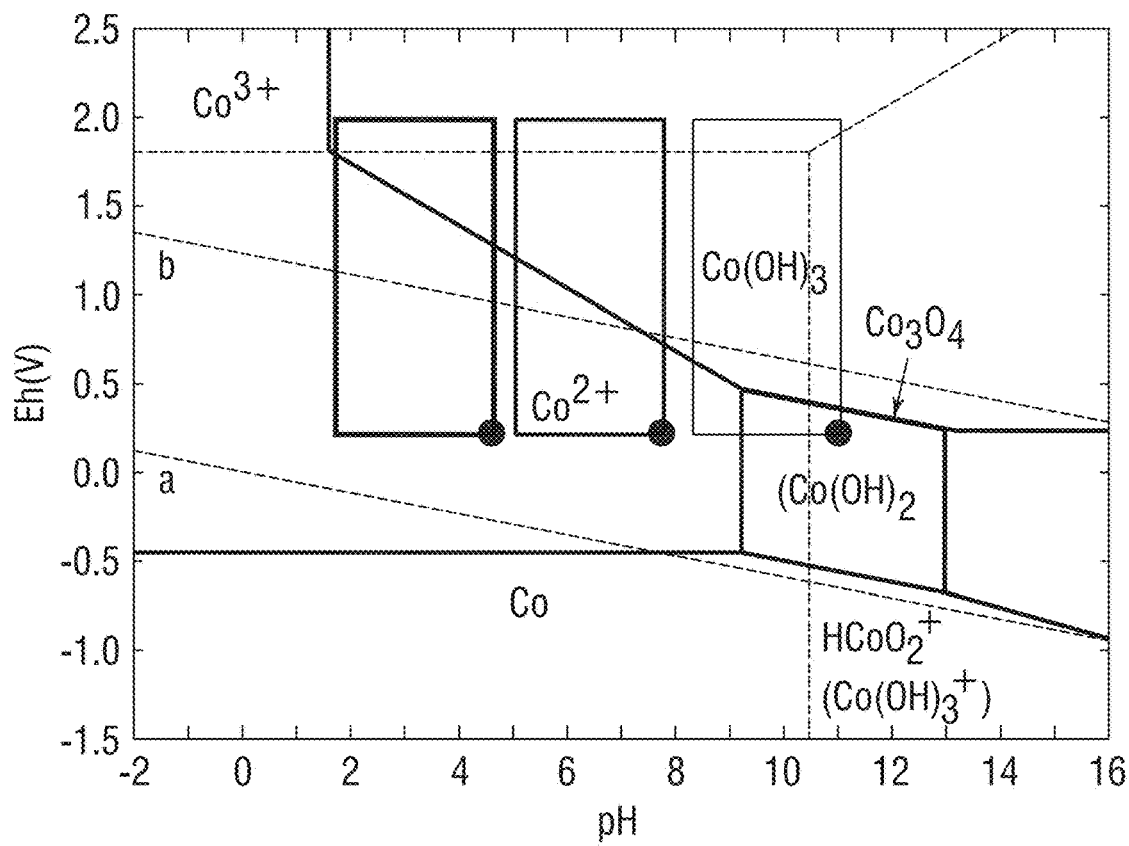
FIG. 1 is an example Pourbaix diagram for cobalt.

Reference throughout this specification to "one embodiment" or "an embodiment" means that a particular feature, structure, material, or characteristic described in connection with the embodiment is included in at least one embodiment of the application, but do not denote that they are present in every embodiment. Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

Conventional wet etch solutions typically have a set reactivity and etch rate for a given material based on the composition and temperature of the solution. Techniques herein, however, provide methods and systems to adjust the etch rate of a solution of a given composition at a given temperature in real time. Additionally, such methods allow adjustment of the etch rate with position on the substrate, which can be based on feed-forward control resulting in greater uniformity across the wafer.

A conventional etch solution has a set solution potential and pH. This composition places the solution at a single point on a Pourbaix diagram. Diagram parameters are set by the solution composition itself. Accordingly, a thermodynamic equilibrium species that will be present when the solution is placed in contact with a surface to be etched is already set, as well as a solubility of the etch products. The initial composition thus determines an etch behavior of a corresponding process or system.

Techniques herein add one or more photoactive components to a liquid etch solution. A photo acid and/or a photo base is added to selectively adjust a pH under illumination. Also, a photo-oxidizer may be added to the liquid etch solution to selectively change a solution oxidation potential under illumination. A given light source or light sources, can be selected to provide wavelengths of light that can be absorbed by the photoactive components causing a desired change in a corresponding molecule by raising/lower a pH, or raising/lowering a voltage potential of the liquid etch solution. These two species move a location of the solution on a Pourbaix diagram and fundamentally change the etch behavior of the solution based on the wavelength and intensity of the light. Selecting the photo acid/photo base and the photo-oxidizer to be reactive to different light wavelengths results in photo-active agents that can be independently controlled. Instead of occupying a single point on the Pourbaix diagram, a solution herein accesses a large region of the parameter space, and a corresponding etch behavior is selectively adjusted according to given photo-induced solution parameters.

There are many photo acids and photo-oxidizers that can be selected for inclusion in liquid etch solutions. With such options, photo-reactive agents can be chosen to have absorption spectra that do not overlap. Accordingly, different light sources or wavelengths can selectively access any of the photo-reactive agents included. The illumination wavelength or wavelengths and intensities can be adjusted in real time or with spatial resolution to adjust the etch behavior with temporal resolution, spatial resolution, or both. Note that any number of photo-reactive agents can be added to a given solution. Thus, there can be both photo acid generators and photo destructive base generators and photo-oxidizer generators included. Some embodiments can have multiple photo-acid generators with each reacting to a different light wavelength.

Temporal control over etch rate enables the etch rate to be slowed as a given etch process approaches an etch endpoint. Such techniques can minimize the etch time and maximize the accuracy of the total etch depth. Spatial control over etch rate allows for correcting non-uniform layer thickness across the wafer surface by increasing etch rate in locations where material is thickest, for example.

Referring now to the Figures, FIG. 1 illustrates an example Pourbaix diagram for cobalt. Other materials to be etched will differ from cobalt in values, but have similar windows for etching. Points on this cobalt Pourbaix diagram represent a location of etchants. The boxes represent a parameter space accessible by photonically tunable etchants. At low pH, cobalt will dissolve into solution as $Co^{2+}$ or $Co^{3+}$ ions. At high pH, the cobalt surface will be passivated as a cobalt hydroxide or cobalt oxide. By using a photo acid, the pH can be photonically lowered to increase the dissolution of cobalt. Any individual photo acid can adjust the pH of the solution by ~1 pH unit, and so a given photo acid is selected for a pH range of interest. A selected photo acid affects a width of the etchant parameter spaces along the x-axis of FIG. 1.

The oxidation potential of an etch solution can be increased at a constant pH using a photo-oxidizer. This change in oxidation potential results in movement along the y-axis of the Pourbaix diagram shown in FIG. 1. Together, independent control of pH and oxidation potential allow two-dimensional motion on the Pourbaix diagram. This allows real time control over etch behavior to better the control substrate processing.

Figure 2:
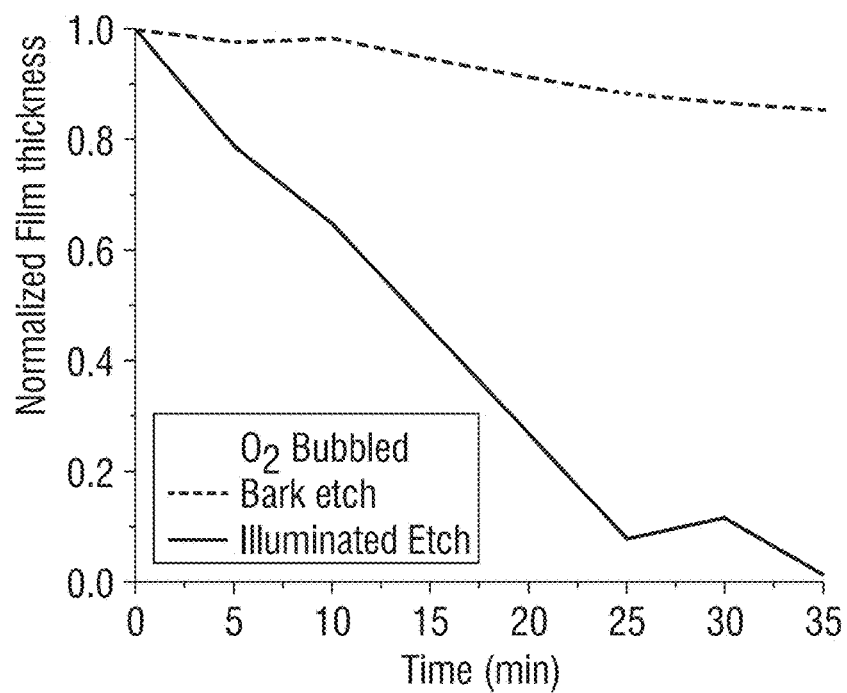
FIG. 2 is a plot for normalized film thickness v. time for cobalt when an etching solution is illuminated.

FIG. 2 illustrates that an etch rate of cobalt may be increased by a factor of 7 by illuminating a solution to change the pH and oxidation potential of the liquid etch solution. In this example, the aqueous etchant contains dissolved oxygen and a dye photosensitizer as the photo-oxidizer. When illuminated, the dye excites the dissolved oxygen to an excited state and increases the oxidation potential of the solution from ~1.23V to ~2.2V. This causes an approximately 7× increase in etch rate.

Figure 3A:
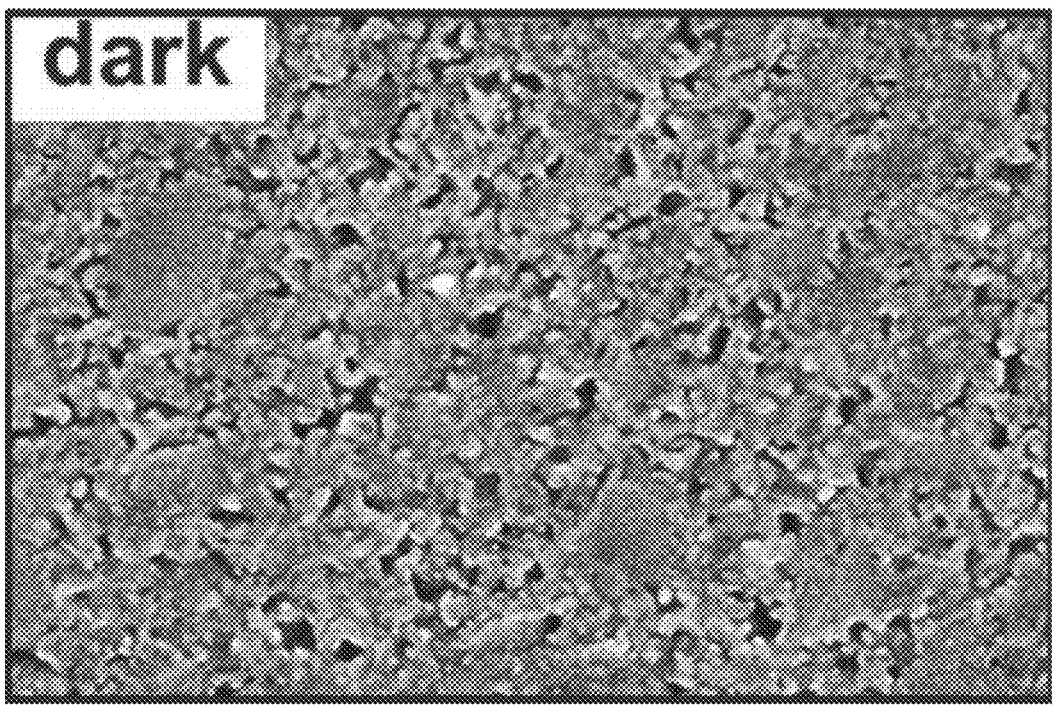
FIGS. 3A, 3B illustrate etched cobalt in the dark and under UV illumination, respectively.
Figure 3B:
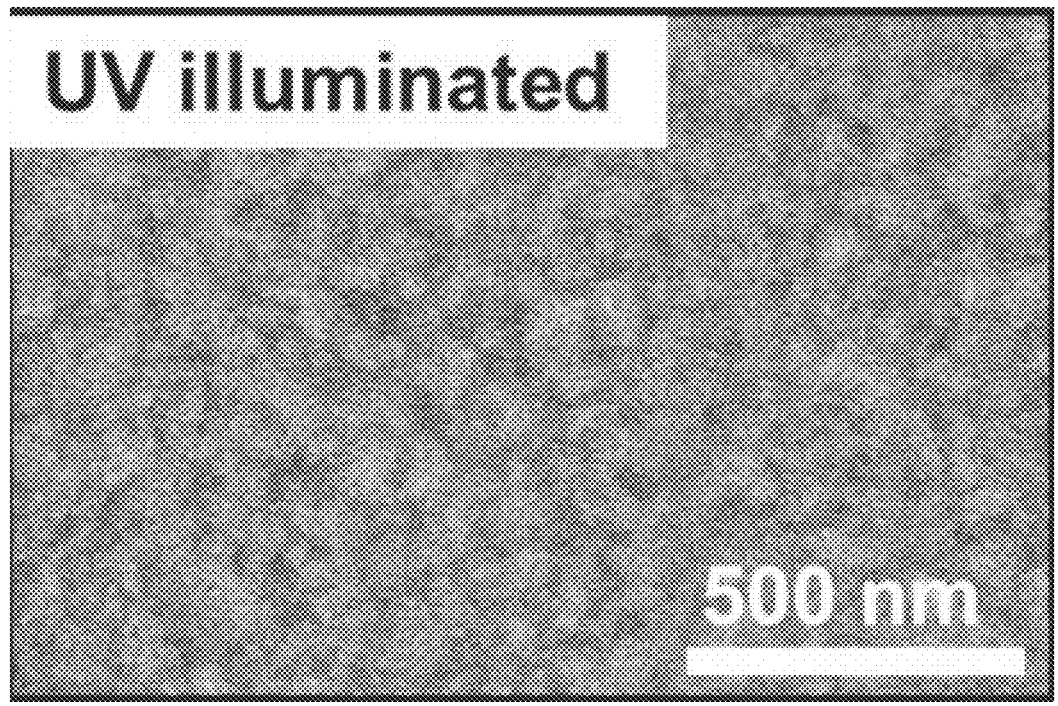

FIGS. 3A, 3B are images illustrating benefits of the techniques herein. In this example, $H_2O_2$ is selected as the photo-oxidizer. Cobalt etch is this example is driven by an oxidation/dissolution mechanism where the oxidant oxidizes Co to $CoO_x$ (with a rate constant of $k_{ox}$). $CoO_x$ is then dissolved in the solution through complexation with etchant molecules (citrate anions) with rate constant of $k_d$. In dark processing, $k_d \gg k_{ox}$ which results in non-uniform etching at grain boundaries leading to pitting and roughening of the surface. When illuminated herein with UV light, $H_2O_2$ cleaves to form two OH* radicals. This increases the oxidation potential of the solution from ~1.8V to ~2.8V. Reactive OH* radicals speed up the oxidation reaction to the extent that $k_{ox} \gg k_d$. Faster oxidation balances etch rate on the surface leading uniform etching of cobalt. In other words, UV radiation balances etchants reactivity in a solution of $H_2O_2$-citrate mixture leading to smooth etching of polycrystalline cobalt.

In liquid etch composition in which the selected photo acid/photo base and photo-oxidizer have short half-lives, a corresponding etch rate can be spatially resolved. Each species's half-life is preferably sufficiently short enough that convective or diffusive travel is short compared to the length scale of spatial resolution. A wafer illuminated at spatially varying intensities will then effectively have a spatially varying etch rate. This can be matched to a thickness of material needing to be removed across the wafer, and can be based on feed-forward control data.

When implemented on a spinner, the illuminating light source can optionally be synchronized to the motion of the substrate, enabling individual regions of the wafer to be illuminated at a time-invariant intensity. Spatially resolved illumination, for example, is executed with an LED array. An LED array works well when low spatial resolution is acceptable. The array can be rotated synchronously to the substrate in the spin chamber, or the spatial intensity of the array can be synchronized to the motion of the wafer. When higher spatial resolution is desired, illumination is executed using a laser source and a scanner. The laser can be moved/scanned over the wafer surface in a motion that provides higher light intensities to areas of the wafer that require higher etch rates. Both of these example implementations can be used to illuminate the wafer with a single wavelength or multiple wavelengths to activate one or several photoactive species in the etch solution. Other light sources can be used. Moreover, given light sources can be combined, for example, thus allowing for zone flood exposure augmented with precise laser scanning.

Figure 4B:
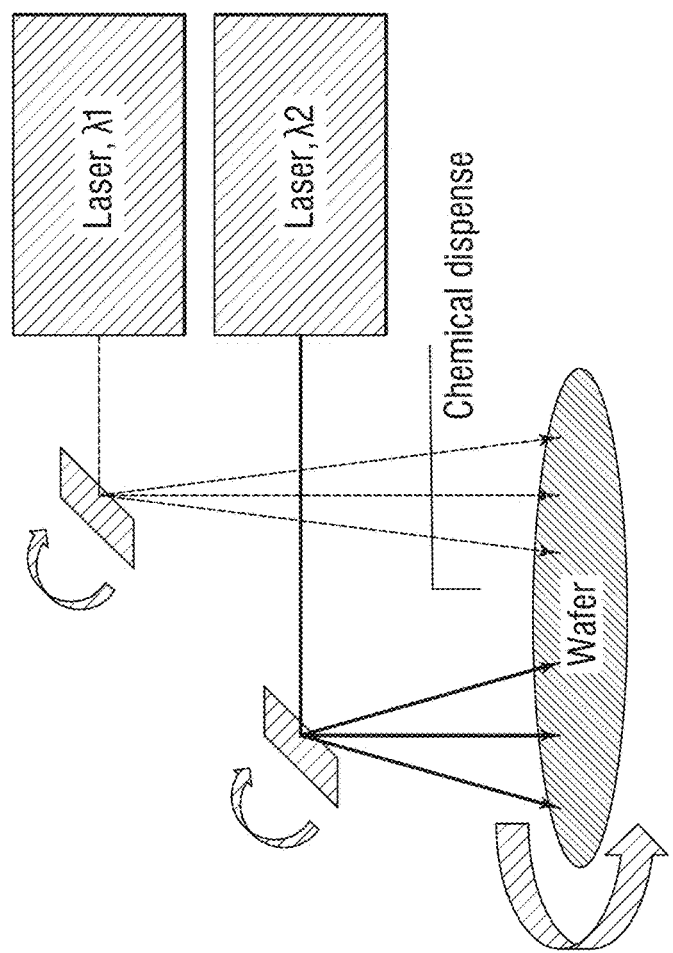
FIGS. 4A, 4B show a schematic of exemplary etching systems where an etchant is dispensed on a wafer in a spin chamber by an LED array.
Figure 4A:
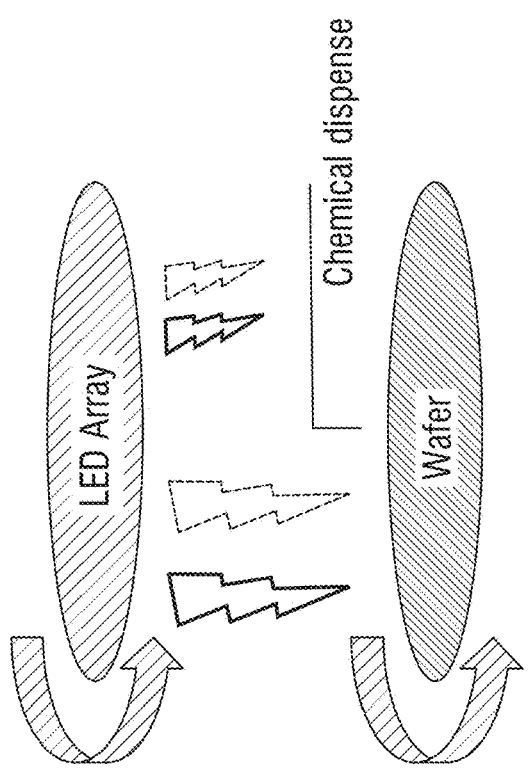

FIGS. 4A, 4B illustrate example system configurations. In the example system shown in FIG. 4A, the LED array can emit a single wavelength or multiple wavelengths by interspersing different emitters within the array. Power of the individual emitters can be adjusted in real time to control the illumination intensity across the surface of the wafer. The LED array can either be mechanically synchronized to the motion of the wafer, or the array can remain stationary while an intensity of the individual emitters is synchronized to the motion of the wafer. In the example system shown in FIG. 4B, illumination of an etchant dispensed on a substrate in a spin chamber is delivered by laser sources. Multiple lasers can be used to illuminate the wafer with multiple wavelengths. Steering optics is used to raster the laser beam over the wafer surface. The dwell time of a laser spot on an individual point on the wafer controls the etch enhancement at that point. Motion of the laser beam can be synchronized to the motion of the substrate.

Photonically tunable etch solutions herein can be made by dissolving the photoactive components and other etch species in a compatible solvent. This photonically tunable etch solution can be dispensed in a single wafer etcher or used in a multi-wafer etch bath as long as the surface of each wafer is positioned to be individually illuminated.

Photo-oxidizers include, but are not limited to, hydroxyl radicals generated by photolysis of peroxide species, chlorine radicals generated by photolysis of $Cl_2$, hypochlorous acid, oxalyl chloride, and vinyl chloride species. Singlet oxygen can be generated chemically, thermally, or photonically using a photosensitizer dye.

Photo acids include, but are not limited to, chemistries based on spyropyrans, metastable carbanions, hydroxypyrenes, and the like. Photo bases include, but are not limited to, chemistries based on malachite green carbinol base, acridinols, hydroxychalcones, and so forth.

One embodiment includes a method of etching a substrate. A substrate is received having a material to be etched from a working surface of the substrate. For example, a particular metal is on the substrate and needs to be removed. The substrate can be received in a processing chamber that can include a spin chamber for rotating the substrate while liquid is dispensed onto the surface of the substrate.

A liquid etch solution is deposited on the working surface of a substrate. The liquid etch solution has an initial pH value and an initial oxidation potential value. The liquid solution includes a first photo-reactive agent responsive to a first light wavelength and a second photo-reactive agent responsive to a second light wavelength.

The liquid etch solution on the working surface of the substrate is irradiated using radiation of the first light wavelength causing the first photo-reactive agent to change a pH value of the liquid etch solution from the initial pH value to a second pH value. This second pH value increases an etch rate of the material from the working surface of the substrate.

The liquid etch solution on the working surface of the substrate is irradiated using the radiation of the second light wavelength causing the second photo-reactive agent to change an oxidation potential value of the liquid etch solution from the initial oxidation potential value to a second oxidation potential value. This second oxidation potential value increases the etch rate of the material from the working surface of the substrate. The liquid etch solution is then removed from the working surface of the substrate. This can happen by stopping dispense and continuing rotation of the substrate until all solution is removed when using a spin dispense system.

With this embodiment, the first photo-reactive agent is a photo acid or a photo base, while the second photo-reactive agent is a photo-oxidizer. The first light wavelength is optionally different from the second light wavelength. Irradiating can include spatially modifying an intensity of light resulting in different areas of the working surface of the substrate receiving different intensities of light. For example, a peripheral portion of the working surface receives greater light irradiation as compared to a central portion of the working surface to counter evaporative cooling effects.

In other embodiments, the spatial illumination is based on etch data from previous etch processes. For example, after examining processed wafers, locations of more or less etching can be identified and correcting by spatial coordinate projection of light in subsequent wet etch processes may be performed. This zone or pixel based projection can also be based on real-time measurements, previous metrology measurements using feed-forward control, or measurements from similar wafers. For example, temperature sensors or heat cameras can monitor temperature across the working surface of the wafer and substrate temperature signatures can be used to add more light or heat to particular areas to counter evaporative cooling effects or other temperature differentials. Irradiation can also be tapered or reduced as etching of a given material approaches an end point.

In other embodiments, illumination can be used to decrease an overall etch rate and/or increase the overall etch rate. Decreasing an etch rate can improve surface morphology or a post-etch surface passivation layer. Thus, solutions can be configured so that increasing a light intensity results in decreasing an etch rate. For example, considering a metal that etches more easily at a high pH, this pH can drop under illumination when the etch solution contains a photo acid. Thus, illumination can be used as a mechanism to cause a slowing of etching. This de-tuning of the etch chemistry can be useful in etching in which multiple surface reactions are needed to form a soluble species, for example, when a metal is first oxidized and then the oxide is dissolved. Lowering the rate constant for oxide dissolution can improve the post-etch surface morphology when the oxidation step is self-limiting.

In some embodiments, the liquid solution can be configured so that an etch process starts upon illumination and stops when illumination is off. That is, in the absence of illumination the reactivity of pH of a particular solution is insufficient to drive an etch process. Thus, without illumination there is no (or insignificant) etching of a working surface until the liquid solution is irradiated. An etch rate can be further controlled by an intensity of irradiation. For example, as light intensity increases, etch rate of the solution increases.

In other embodiments of the techniques presented here, illumination may be used to drive a cyclic etch process. In a traditional cyclic etch process, the material surface is chemically modified using one etch solution and the modified layer is dissolved using a second etch solution. The modified layer should be self-limiting, and the dissolution should be selective so that none of the unmodified material is removed. These digital etches are advantageous because the total etch amount only depends on the number of cycles. The self-limiting nature of the reactions gives excellent within-wafer uniformity. Cyclic processes tend to be slow due to the time required to switch between etch solutions, and the small amount of material removed in each cycle.

The same type of cyclic etch process can be accomplished using time-varying illumination of a single photoactive etch solution. The modified surface layer can be formed in one location on the Pourbaix diagram defined by a first pH and a first oxidizing potential. The solution can then be adjusted to a second pH and second oxidizing potential by toggling the photoactivity of the species in the solution. Toggling the photoactivity of a species in solution refers to stopping illumination if the species is currently illuminated or beginning illumination if the species is not currently illuminated. The second pH and oxidizing potential are appropriate to dissolve the modified surface layer. Cyclic etching is accomplished by dispensing a single etch solution over the wafer and alternating illuminated and dark states. Changing the illumination conditions is much faster than switching etch solutions, so faster cycling and thus faster overall etch rates are possible.

A non-limiting example for cobalt is given. A passivation layer is formed on a cobalt surface at a high oxidation potential and high pH. This condition is created by illuminating the etch solution with wavelength $\lambda 1$ which activates the photo-oxidizer in the solution. This passivation layer consists of cobalt oxide. The cobalt oxide is then dissolved by lowering the oxidation potential and pH of the solution. This is done by stopping illumination with wavelength $\lambda 1$ to stop photo-oxidation and beginning illumination with wavelength $\lambda 2$ to activate the photoacid in the solution. The pH drops when the photo acid is illuminated and the oxide layer is then dissolved. Additional additives (photoactive or inert), such as ligands, may be added to the etch solution to promote the dissolution of the passivation layer.

In another variation, dissolution of the modified layer can be promoted using a photoactive complexing agent that becomes reactive upon illumination. In the example of cobalt etch, after photo-oxidation with illumination with wavelength $\lambda 1$, the solution (containing photoactive complexing agent) is illuminated with wavelength $\lambda 2$ that initiates the complexation thus etching of the modified layer. In some cases, depending on the material, the first step (the modification step) may or may not be necessary.

Examples of photoactive complexing agents include, molecular photo-switches such as spiropyran and naphthopyran derivatives and compounds.

Accordingly, techniques herein enable temporal and spatial control of etch rate on a wafer. Activity or reactivity of wet etchants can be photonically tuned by coordinate location to compensate for temperature variations across the wafer. Etchants and compositions used herein can be stored in a less reactive state so that compositions are more stable, less likely to react with the storage tank, dispensing line, filter, or valve wetted materials, and be less reactive in the waste stream. The etchant becomes more reactive under illumination with particular wavelengths, and a single, storage-stable composition can be for multiple different etch processes and materials to remove by tuning the photoreactive agents therein when on a substrate surface.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present application. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives. Such variations are intended to be covered by the scope of this disclosure. As such, the foregoing descriptions of the embodiments are not intended to be limiting. Rather, any limitations to the embodiments are presented in the following claims.

The invention claimed is:

1. A method of etching a substrate, the method comprising:
    depositing a liquid etch solution on a working surface of a substrate having a material to be etched from the working surface of the substrate, the liquid etch solution having an initial pH value and an initial oxidation potential value, the liquid etch solution including a first photo-reactive agent responsive to a first light wavelength and a second photo-reactive agent responsive to a second light wavelength;
    irradiating the liquid etch solution on the working surface of the substrate using the first light wavelength causing the first photo-reactive agent to change a pH value of the liquid etch solution from the initial pH value to a second pH value that increases or decreases an etch rate of the material from the working surface of the substrate; and
    removing the liquid etch solution from the working surface of the substrate.

2. The method of claim 1, further comprising: irradiating the liquid etch solution on the working surface of the substrate using the second light wavelength causing the second photo-reactive agent to change an oxidation potential value of the liquid etch solution from the initial oxidation potential value to a second oxidation potential value that increases or decreases the etch rate of the material from the working surface of the substrate.

3. The method of claim 1, wherein
    the first photo-reactive agent is a photo acid or a photo base, and the second photo-reactive agent is a photo-oxidizer.

4. The method of claim 2, wherein
    the first light wavelength is different from the second light wavelength.

5. The method of claim 2, wherein
    irradiating the liquid etch solution on the working surface of the substrate includes spatially modifying an intensity of light irradiating the liquid etch solution, resulting in different areas of the working surface of the substrate receiving different intensities of light.

6. The method of claim 5, wherein
    spatial illumination is based on etch data from previous etch processes.

7. The method of claim 5, wherein
    spatial illumination is based on real-time temperature measurements of the working surface of the substrate.

8. The method of claim 5, wherein
    spatial illumination is based on metrology data of the substrate measured prior to depositing the liquid etch solution on the working surface of the substrate.

9. The method of claim 1, further comprising rotating the substrate while depositing the liquid etch solution on the working surface.

10. The method of claim 2, further comprising reducing irradiation of the liquid etch solution as a given etch treatment approaches an etch end point.

11. The method of claim 1, wherein
    the material to be etched is selected from the group comprising metal, semiconductor, and dielectric.

12. A method of performing a cyclic etch process on a substrate, the method comprising:
    depositing a liquid etch solution on a working surface of a substrate having a material to be etched from the working surface of the substrate, the liquid etch solution having an initial pH value and an initial oxidation potential value, the liquid etch solution including a first photo-reactive agent responsive to a first light wavelength and a second photo-reactive agent responsive to a second light wavelength;
    irradiating the liquid etch solution on the working surface of the substrate using the first light wavelength causing the first photo-reactive agent to change a pH value of the liquid etch solution from the initial pH value to a second pH value, resulting in the formation of a modified layer on the working surface of the substrate;
    stopping the illumination of the liquid etch solution using the first light wavelength and irradiating the liquid etch solution using the second light wavelength causing the second photo-reactive agent to change a pH value of the liquid etch solution from the second pH value to a third pH value, resulting in the dissolution of the modified layer from the working surface of the substrate;
    repeating the depositing a liquid etch solution on a working surface of a substrate, the irradiating the liquid etch solution on the working surface of the substrate using the first light wavelength, the stopping the illumination of the liquid etch solution using the first light wavelength and illuminating the liquid etch solution on the working surface of the substrate using the second light wavelength, in this sequence, until a desired etch amount is reached; and
    removing the liquid etch solution from the working surface of the substrate.

13. The method of claim 12, wherein
    the photo-reactive agent is a photo base or photo acid.

14. A method of performing a cyclic etch process on a substrate, the method comprising:
    depositing a liquid etch solution on a working surface of a substrate having a material to be etched from the working surface of the substrate, the liquid etch solution having an initial pH value and an initial oxidation potential value, the liquid etch solution including a first photo-oxidizer agent responsive to a first light wavelength and a second photo-oxidizer agent responsive to a second light wavelength;
    irradiating the liquid etch solution on the working surface of the substrate using the first light wavelength causing the first photo-oxidizer agent to change an oxidation potential value of the liquid etch solution from the initial oxidation potential value to a second oxidation potential value resulting in the formation of a modified layer on the working surface of the substrate;

stopping the illumination of the liquid etch solution using the first light wavelength and irradiating the liquid etch solution using a second light wavelength causing the second photo-oxidizer agent to change an oxidation potential value of the liquid etch solution from the second oxidation potential value to a third oxidation potential value, resulting in the dissolution of the modified layer from the working surface of the substrate;

repeating the depositing a liquid etch solution on a working surface of a substrate, the irradiating the liquid etch solution on the working surface of the substrate using the first light wavelength, the stopping the illumination of the liquid etch solution using the first light wavelength and the irradiating the liquid etch solution using the second light wavelength, in this sequence, until a desired etch amount is reached; and removing the liquid etch solution from the working surface of the substrate.

15. The method of claim 14, wherein stopping the illumination of the liquid etch solution using the second light wavelength causes a change to the oxidation potential value of the liquid etch solution from the second oxidation potential value to the initial oxidation potential value, resulting in the dissolution of the modified layer from the working surface of the substrate.

* * * * *